United States Patent [19]

Bharat

[11] 4,038,565
[45] July 26, 1977

[54] FREQUENCY DIVIDER USING A CHARGED COUPLED DEVICE

[76] Inventor: Ramasesha Bharat, 2905 Echo Hill Way, Orange, Calif. 92667

[21] Appl. No.: 511,861

[22] Filed: Oct. 3, 1974

[51] Int. Cl.² .......................................... H03K 21/36
[52] U.S. Cl. ............................. 307/225 C; 307/221 D
[58] Field of Search ........... 307/221 C, 221 D, 225 C, 307/225 R, 243, 251; 328/48, 42, 37

[56] References Cited

U.S. PATENT DOCUMENTS

| | | | |
|---|---|---|---|
| 3,258,696 | 6/1966 | Heymann | 328/42 |
| 3,322,974 | 5/1967 | Ahrons et al. | 307/221 C |
| 3,614,632 | 10/1971 | Leibowitz | 328/48 X |
| 3,657,658 | 4/1972 | Kubo | 307/225 R |
| 3,675,144 | 9/1972 | Zuk | 307/221 C |
| 3,700,932 | 10/1972 | Kahng | 307/221 C |
| 3,725,791 | 4/1973 | Moreau et al. | 328/48 X |
| 3,746,883 | 7/1973 | Kovac | 307/221 C |
| 3,792,322 | 2/1974 | Boyle et al. | 307/304 X |
| 3,811,055 | 5/1974 | Weimer | 307/221 D |
| 3,868,516 | 2/1975 | Buss | 307/221 D |

*Primary Examiner*—John S. Heyman
*Attorney, Agent, or Firm*—Nathan Edelberg; Daniel Sharp; Jeremiah G. Murray

[57] ABSTRACT

A CCD with N bits is clocked at a frequency $f$, which may be either constant or variable over a wide range. Meanwhile, a charge introduced into the first bit at $t = 0$ reaches the nth bit, $n$ clock periods later, namely, at $t = n/f$. If this charge is sensed to give an output signal and the signal is fed back to introduce a charge again into the first bit, then a periodic output is obtained with pulses spaced every $n/f$ seconds; the output frequency is therefore, $1/n$ times the input clock frequency. Output frequencies $f, f/2, f/3, \ldots f/N$ can be obtained by selecting $n$. The system includes the following structure:
1. A tapped N-bit CCD delay line.
2. Initial charge injection method.
3. Charge sink.
4. $n$ - selector ($n = 1, 2, 3, \ldots N$).
5. Feedback to trigger subsequent charge injection.

8 Claims, 5 Drawing Figures

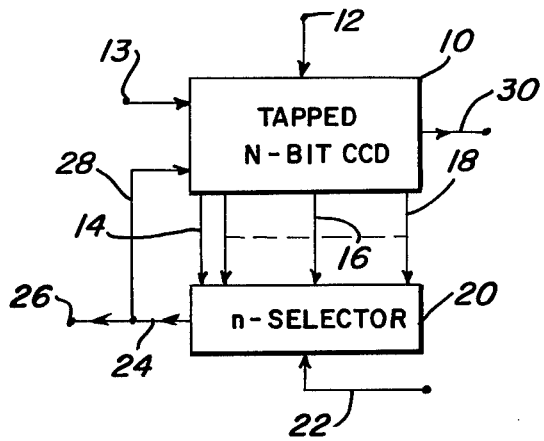
FIG. 1
FIG. 2
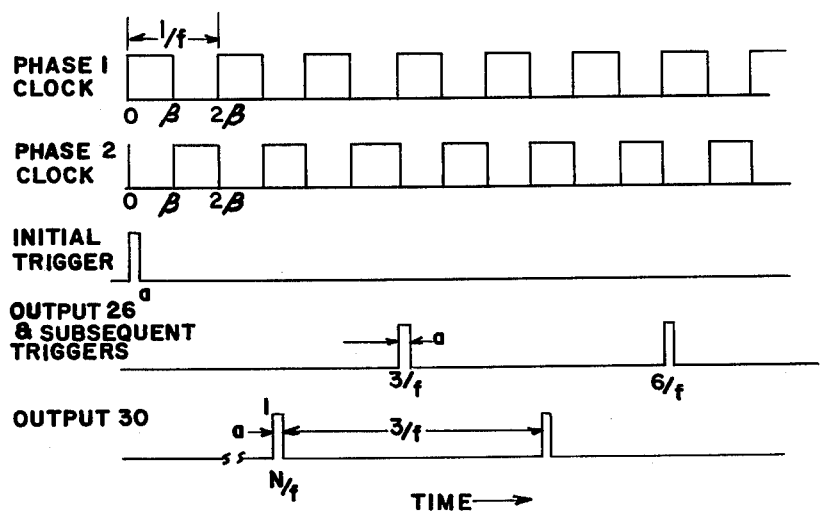

FREQUENCY DIVIDER USING A CHARGED COUPLED DEVICE

RIGHTS OF THE GOVERNMENT

The invention described herein may be manufactured, used, and licensed by or for the United States Government for governmental purposes without the payment to me of any royalty thereon.

FIELD OF THE INVENTION

The present invention pertains to frequency dividing circuits, and more particularly to such a circuit utilizing a solid state charge-coupled device.

BRIEF DESCRIPTION OF THE PRIOR ART

Frequency dividers are widely used in such applications as frequency synthesizers and electronic timepieces. The general approach to obtaining a divide-by-$n$ counter has been to use several stages of binary counters interconnected through logic gates to give an output corresponding to the selected n. With this approach, when the divider circuit is integrated on a single silicon (Si) chip, considerable space is taken up by the logic and the interconnections so that the required chip size is several times the total area of all the binary counter stages, unless only the binary counts of $n$, namely $n = 2^m (m = 1, 1, 3, \ldots )$ are desired.

Both metal-oxide-semiconductor (MOS) and bipolar technology have been used for fabricating fully integrated frequency dividers in this manner. Relevant technology is disclosed in R. G. Daniels and R. R. Burges, "The Electronic Wrist Watch: An Applicattion For Si-Gate CMOS IC's", ISSCC Digest of Tech. Papers, Vol. 14, 1971, pp. 62–63; F. Leuenberger and E. Vittoz, "Complementary-MOS Low-Power Low-Voltage Integrated Binary Counter", Proc. of the IEEE, Vol. 57, No. 9, September 1969, pp. 1528–1532. The lowest dynamic power consumption reported is 1.6 nW/kHz per scale-of-two stage using Si-gate complementary metal-oxide-semiconductor (CMOS) technology. This stage contains 19 MOS transistors and occupies an area of about 70 sq. mils. See E. Vittoz, B. Gerber, and F. Leuenberger, "Silicon-Gate CMOS Frequency Divider For The Electronic Wrist Watch", IEEE J. Solid-State Circuits, Vol. SC-7, No. 2, April 1972, pp. 100–104. The bipolar binary cell occupies about the same area while consuming over 20 times more power. A typical 5 MHz CMOS divide-by-$n$ ($n = 2, 4, 6, 8, 10$) counter on the market (for example, RCA Type CD4018A) is already of medium-scale integration (MSI) complexity on a chip (75 × 90 sq. mil) and consumes about 1 to 4 mW, while a divide-by-$n$ ($n = $ 2to 999) counter will be of large-scale integration (LSI) complexity, containing about 1,000 active transistors and consuming about 50 mW. See R. E. Funk, "Low-Power Digital Frequency Synthesizers Utilizing COS/MOS IC's", RCA Application Note ICAN-6716. Thus, even if improvements are made in the design and technology of MOS binary counters, the space used and the power consumed by a divide-by-$n$ counters, the space used and the power consumed by a divide-by-$n$ counter will be dominated by the associated logic and interconnections.

BRIEF DESCRIPTION OF THE PRESENT INVENTION

The present invention proposes a circuit for using a charge-coupled device (CCD) shift register for performing frequency division and examines the merits and limitations of such a divider. The proposed divider is non-binary and can divide by any arbitrary $n$ (3 to N) without additional logic. Charge-coupled devices, per se, are not claimed as the invention of the present application. Such devices are prior art. For example, see U.S. Pat. No. 3,792,322.

BRIEF DESCRIPTION OF THE FIGURES

FIG. 1 is a block system configuration for a frequency divider using a charge-coupled device (CCD).

FIG. 2 is a timing sequence for the divider of FIG. 1, using a two-phase CCD, where the tap-off point is $n = 3$.

DETAILED DESCRIPTION OF THE INVENTION

Figure 3:
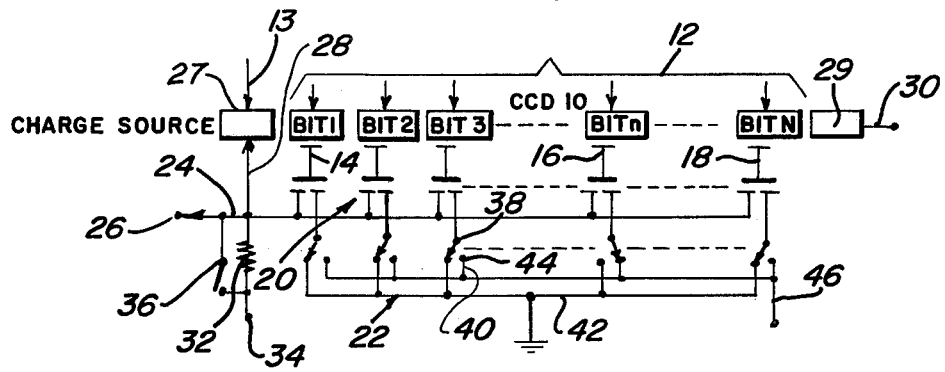
FIG. 3 is a schematic for an integrated frequency divider using a CCD.

Referring to the figures and more particularly FIG. 1 thereof, a CCD 10 is indicated with N bits clocked at a frequency $f$ at the clock input 12. As a result, a charge introduced into the first bit at $t = 0$ reaches the $n$th bit, $n$ clock periods later, namely at $t = n/f$. As will become apparent hereinafter, this charge is sensed at any tap from the first tap 14 through the $n$th tap 16 to the Nth 18. The tapped signals provide inputs to an $n$-Selector 20 which may be manually or automatically addressed at input 22, to permit the selection of frequency division. Output signals from the Selector 20 appear at lead 24 and at terminal 26. A feedback path 28 connects output lead 24 to a first input of the tapped CCD 10. A second input 13 provides an initial trigger to the CCD. A charge sink, as explained hereinafter, is provided to develop a final output signal at 30. This signal will be a pulse related to the sensing of a charge which has propagated from the first bit to the Nth bit.

As will be appreciated by reviewing FIG. 1, if a CCD 10 with N bits is clocked at a frequency f, a charge introduced into the first bit at $t = 0$ reaches the $n$th bit, $n$ clock periods later, namely at $t = n/f$. If this charge is sensed to give an output signal at 24, and the signal fed back at 28 to introduce a charge again into the first bit, then a period output is obtained at 24 and 26 with pulses spaced every $n/f$ second; the output frequency is, therefore, $1/n$ times the input clock frequency. Output frequencies $f, f/2, f/3, \ldots f/N$ can be obtained by selecting $n$. This is accomplished through the $n$-Selector 20. As will be appreciated, the system must include the following features:

1. A tapped $n$-bit CCD delay line 10
2. Initial charge injection through 13
3. Charge sink to develop output B at 30
4. $n$-selector 20
5. Feedback to trigger subsequent charge injection, through path 28.

FIG. 2 illustrates an example of timing sequence in a two-phase CCD used for division by 3. It should be noted that the output may be taken either at terminal 26 or at the charge sink 30 — or both. Although frequency division may be made by any multiple dividers and with a CCD using one or two or three or four phase clocks, division by 3 and a two phase clock have been chosen to illustrate the principles of circuit operation.

FIG. 3 illustrates schematically a combination of elements for implementing the features of the system.

Common reference numerals have been used between corresponding parts in FIG. 1 and FIG. 3. As shown in FIG. 3, the CCD line 10 made up of individual charge-coupled devices, is driven by clock inputs 12. The CCD line 10 has a charge sensor at every bit, as indicated by 14, 16 and 18. The sensor may be either a floating diffused or implanted area within one of the wells of a CCD structure, or a floating gate buried in the silicon dioxide layer or other suitable insulator. The CCD may be designed to be clocked by one, two, three, or four phases. This technology is disclosed in the following publications:

1. R. D. Melen and J. D. Meindl, "One-phase CCD: A New Approach To Charge-Coupled Device Clocking", IEEE J. Solid-State Circuits, Vol. SC-7, No. 1, February 1972, pp. 92-93.

2. W. F. Kosonocky and J. E. Carnes, "Charge Coupled Digital Circuits", ISSCC Digest of Tech. Papers, 1971, pp. 162-163.

3. W. S, Boyle and G. E. Smith, "Charge Coupled Semiconductor Devices38 , Bell System Tech. J., Vol. 49, No. 4, April 1970, pp. 587-593.

4. W. E. Engeler, J. J. Tiemann, and R. T. Baertsch, "A Memory System Based On Surface-Charge Transport", ISSCC Digest of Tech, Papers, 1971, pp. 164-165.

The previously mentioned $n$-Selector 20 is actually composed of a plurality of MOS transistors (MOST). The charge sensor for each bit is respectively connected to the gate electrode of a corresponding MOST. Particular bits are selected by connecting source of the MOSTs to one of two bias conditions. This is generally indicated by reference numeral 22 which was previously shown in FIG. 1 as effecting addressing. The drain of all MOSTs are connected together at 24 and extend to the output terminal 26. The initial trigger pulse at 13 is introduced to the various bits of the CCD 10 by propagating the initial trigger pulse through a charge source 27. The finally propagated pulse from bit N is made available, through a charge sink 29 to the output terminal 30. A load resistor 32 is connected between the common drain terminals of the MOSTs and a drain bias 34. A bypass switch 36 is connected across the load resistor 32 and shorts the resistor when a reset is desired.

The addressing as generally indicated by reference numeral 22 in FIGS. 1 and 3 may be envisioned by a plurality of switches 38, each connected between the source of a MOST and either ground 42, or a bias voltage 46 via switch contacts 44 and leads 40.

Figure 4:
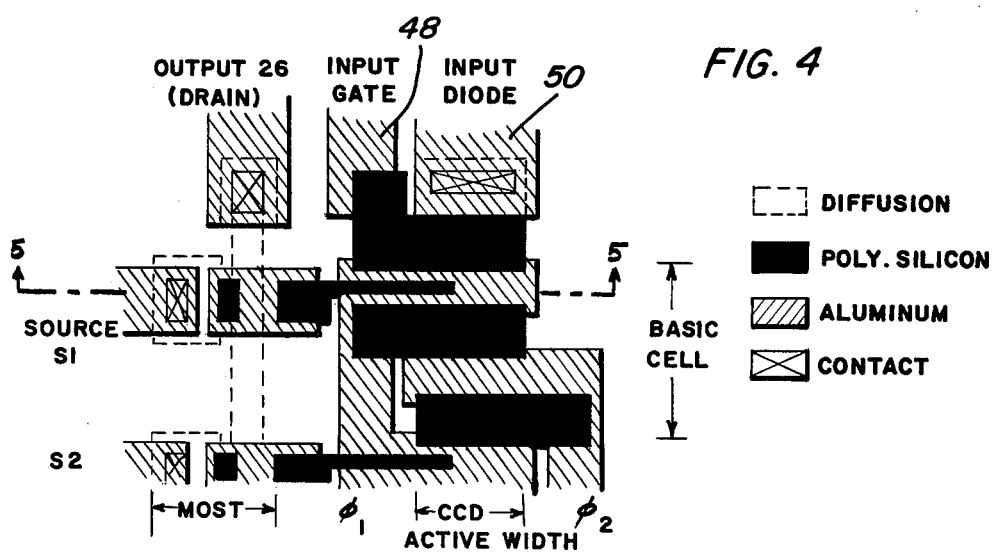
FIG. 4 is a sample layout of a basic frequency divider cell.
Figure 5:
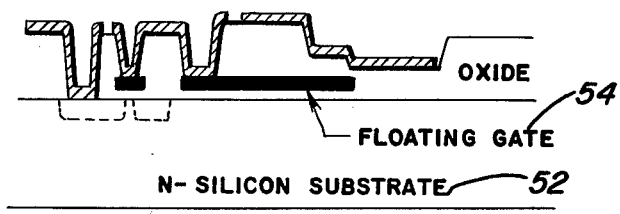
FIG. 5 is a cross-sectional view of the basic cell, taken along a plane passing through section line 5—5.

FIGS. 4 and 5 show the layout and cross-sectional of a sample structure for the CCD/MOST combination desired.

The charge injection can be obtained by a diode and gate combination 50, 48 (FIG. 4) with the diode biased "ON" each time a pulse appears at output 26. The initial charge pulse has to be created by an independent trigger, perhaps derived from the clock's ON switch (not shown).

The $n$-selection is done by a chain of MOS transistors (MOSTs) with their drains connected to a common load resistor 32 and bias supply $V_D$ at 34. Each MOST gate is connected to the charge sensor on the corresponding CCD bit. The MOST sources can be individually biased high or low. The MOSTs are of the enhancement type, so that each of these MOSTs can turn on only if its source bias $V_S$ is high and at the same time its gate is activated by a voltage $V_G$ from the charge sensor. Thus, by placing the source of the nth MOST at a high bias $V_B$ and grounding all the other MOST sources, a drain current pulse can be obtained, in that MOST when the initially triggered charge is clocked past the nth bit of the CCD. Since all the other MOSTs are off, the voltage output across the load resistor 32 is a pulse occurring at time $t = n/f$. It is assumed here that the sensor is located under the first gate in each bit. This output 26 is also used to trigger a fresh packet of charge from the input diode gate combination 50, 48 and start the next cycle. Thus, a pulse appears at output 26 every $n/f$ second, starting at $t = n/f$. Note that the charge pulse in the CCD continues to be clocked down the line irrespective of which $n$ has been selected. This charge may be removed at the end of the CCD line either by means of a reverse-biased diode or by injection (charge sink 29) into the substrate 52 (FIG. 5) where it can recombine. Note that if this charge is allowed to flow out through a sensing circuit, it also can be used as the output 30 at the divided frequency $f/n$ with the first pulse appearing at $t = N/f$ for any $n$. It is assumed here that sinking of the charge is done from the first gate of the Nth bit.

If the substrate 52 (FIG. 5) is N-type Si, the clock voltages will be negative with respect to the substrate so that the $V_G$ obtained on a floating gate 54 (FIG. 5) is also negative, which is the proper polarity for turning on a P-channel enhancement type MOST. Thus, all the MOSTs for the n-Selector 20 can be fabricated on th same wafer as the CCD with a single diffusion step for the MOST drain and sources as well as the CCD charge input and output diodes. Note that a single long diffusion area may be used for all the drains, since they are all connected to resistor 32. A similar argument applies if the substrate is P-type Si, except that the usual problems associated with N-channel enhancement MOS structures may be encountered, and substrate biasing or Si gate or both may be required to overcome them; a channel-stop diffusion will also be needed.

The switching of the source bias on the MOSTs may be done manually or though electronic addressing circuitry. Where manual selection is required, as indicated by 22 in FIG. 3, a decimal code is convenient, while this is not necessary with electronic addressing circuitry. This circuit may be a separate unit, though ideally, of course, it should be integrated on the same chip as the divider, in which case, its design has to be carried out concurrently to ensure compatibility with the divider schematic outlined above.

In the divider application, clock frequency is the input variable so that the synchronism between the pulses for the different clock phases of the CCD has to be maintained as the clock frequency is varied. Two-phase clocking is the simplest to implement in this regard. One phase can be obtained from the other through the use of an inverter and a fixed d-c bias (not shown); the 180° phase difference required is thus easy to maintain, even if any pulse shaping is needed in order to improve charge transfer efficiency in the CCD. Two-phase clocking offers some other advantages, also. To move the charge one bit, only two transfers are needed so that the transfer inefficiency per bit can be lower than in a three-phase or four-phase system. A two-phase (as also a four-phase) system can be designed to be self-shielded. The only disadvantage of the two-phase as opposed to the three- or four-phase systems is that, in order to obtain unidirectional flow of charge, either two substrate-doping densities or two oxide thicknesses are required along the CCD line. But this increase in processing complexity is not significant, as two oxide levels are required in any case if a floating-gate sensor is to be used.

FIGS. 4 and 5 show the layout and cross-section of a sample structure for the CCD/MOST combination desired. A two-phase system with two oxide thicknesses has been selected in this example. Polycrystalline Si is used as the gate electrode at the lower level and aluminum as the upper gate electrode. The gates overlap, and the structure is self-shielded, so that the surface potential is well defined everywhere along the CCD line. The charge sensor is a floating Si gate which can be incorporated with no additional technology needed; the MOS gate is also formed in this step. The substrate is N-type Si; holes are injected from a diffused P-region and gated by an input gate into the CCD line. The same diffusion step forms the source and drain regions of the P-channel MOST.

The CCD frequency divider has several features which can be of advantage. It is non-binary in operation, so that any arbitrary n within the capacity of the CCD line can be addressed. The logic circuits associated with the interconnection of binary counters are eliminated, leading to a simpler circuit design. With current technology, the area occupied including bonding pads will be about 1000 sq. mils. for a 10 channel divider and about 4500 sq. mils. for a 100 channel divider which is a definite improvement over comparable CMOS counters. The power comsumption of the CCD stages is less than 1W per bit al 1MHz (1 nW/kHz) which is also superior to CMOS performance. At present, the upper frequency limit for both CCD and MOS dividers is about 10 MHz. CCD technology is still quite young and can be expected to gain further over MOS as the understanding of CCD operation improves, leading to better design; the high frequency limit may go up by an order of magnitude. CCD dividers are limited at the low frequency end by thermal generation rate and trapping due to slow surface states. The present limit is about 1 kHz and can be improved only with better material and processing to reduce slow-state density and by operation at lower temperatures.

Since the sampling for output 26 leaves the travel of the charge down the CCD line 10 undisturbed, output 30 can also be used simultaneously. If n is large, the transfer inefficiency of the CCD stages starts becoming a significant factor. For larger values of n, the sensor signal applied to the MOST gate (16, 18) will be smaller, and correspondingly, the pulses at output 26 will have a smaller amplitude. Thus, at output 26 both the initial delay and the amplitude of the pulses are dependent upon the dividing factor n. However, at output 30 both these quantities are independent of n; the starting delay is always N/f, and the amplitude is reduced by the inefficiency of transfer through N bits. If the longer delay (except when n = N) can be tolerated, it may be better to use output 30, since the amplitude of the output signal is fixed and, therefore, easier to process in later stages (as, for example, through a threshold gate stage) even though this amplitude is always smaller (except when n = N) than at output 26. It should be noted, however, that if a small n is used on a long CCD, the difference in delay of the two outputs may be considerable. Often in counter applications where the divided frequency is compared with a frequency standard and the error signal is used to adjust the input frequency, it is desirable to obtain the error signal as quickly as possible. In such cases, output 26 should be used.

If the transfer inefficiency is too large, the delayed charge may become big enough to trigger additional spurious charge input pulses making the divider inoperative. The trigger has to be insensitive to delayed charge, yet sensitive to charge from the last bit of the N-bit CCD. In the case of a long CCD line, this requirement leads to the necessity of having a very good transfer efficiency per bit.

The major limitation of the proposed divider is one that is common to all CCDs; namely, that unless every bit on the CCD line works properly, the entire CCD may become inoperative. In MOS/LSI technology, discretionary wiring can be used to ensure that local defects on the chip do not disqualify the entire chip. Such an approach is not possible with CCDs; hence, a much closer control on the substrate material and the processing is required to ensure reasonable yields. However, with the method proposed here, even if the CCD or MOST line becomes open-circuited at the $m$th stage, then frequency division can still be performed for all values of $n$ less than $m$ provided the output is taken at point 26.

The use of CCDs for frequency division is feasible and can offer some advantages over other approaches for division by arbitrary n; namely, simpler circuit design than with interconnection of binary counters, smaller chip size, and lower power dissipation. At low frequencies MOS/LSI counters will retain the advantage. At high frequencies, however, CCD dividers can be expected to gain ground on MOS and bipolar divide-by-$n$ counters.

It should be understood that the invention is not limited to the exact details of construction shown and described herein for obvious modifications will occur to persons skilled in the art.

Wherefore I claim the following:

1. A frequency divider comprising:
   a tapped N-bit charge coupled device;
   means connected to a clock input of the charge coupled device for introducing clock pulses thereto;
   means connected to a trigger input of the charge coupled device for introducing an initial propagating trigger pulse thereto to initiate charge injection;
   means connected to a plurality of outputs of the charge coupled device, corresponding to the N bits of the charge coupled device, for selecting transmission of preselected tapped signals from the charge coupled device to an output terminal of the selecting means at which a frequency divided signal appears; and
   feedback means connected between an output terminal of the selecting means and a feedback input terminal of the charge coupled device to provide trigger pulses subsequent to the initial trigger pulse to trigger subsequent charge injection.

2. The subject matter of claim 1 together with an output communicating with the Nth bit of the charge coupled device for providing an output pulse when each trigger pulse propagates completely down the N bits of the charge coupled device.

3. The subject matter of claim 1 together with means connected to the selecting means for addressing preselected tapped signals from the N bits of the charge coupled device, thus permitting transmission of tapped signals to the selecting means output.

4. The subject matter of claim 1 wherein said means for introducing includes a charge source positioned between the first bit of the charge coupled device and the trigger input for coupling the initial trigger pulse to the first bit.

5. The circuitry set forth in claim 4 together with means for connecting the output terminal of the selecting means to the charge source for coupling the subsequent trigger pulses to the first bit of the charge coupled device.

6. The subject matter set forth in claim 1 wherein the selecting means comprises a plurality of charge sensors, each sensor coupled to the gate of an MOS transistor, the sources of the MOS transistors selectively connected to biasing means and the drains of the MOS transistors connected to the output terminal of the selecting means.

7. The subject matter of claim 6 wherein the biasing means are selectively connected to reference potential.

8. The circuitry defined in claim 7 wherein the drains of the MOS transistors are also connected to a bias potential through a load resistor.

* * * * *